US012722498B2

(12) United States Patent
Pfeilschifter et al.

(10) Patent No.: US 12,722,498 B2
(45) Date of Patent: Sep. 1, 2026

(54) VEHICLE ELECTRICAL SYSTEM HAVING A HIGH-VOLTAGE BRANCH, A LOW-VOLTAGE BRANCH, AND LOW-VOLTAGE-SIDE INSULATION FAULT DETECTION

(71) Applicant: Vitesco Technologies GmbH, Regensburg (DE)

(72) Inventors: Franz Pfeilschifter, Walderbach (DE); Jürgen Kuffer, Beratzhausen (DE)

(73) Assignee: Vitesco Technologies GmbH, Regensburg (DE)

( * ) Notice: Subject to any disclaimer, the term of this patent is extended or adjusted under 35 U.S.C. 154(b) by 122 days.

(21) Appl. No.: 18/354,243

(22) Filed: Jul. 18, 2023

(65) Prior Publication Data

US 2023/0356596 A1 Nov. 9, 2023

Related U.S. Application Data

(63) Continuation of application No. PCT/EP2021/086812, filed on Dec. 20, 2021.

(30) Foreign Application Priority Data

Jan. 18, 2021 (DE) ..................... 10 2021 200 414.8

(51) Int. Cl.
*H02H 3/00* (2006.01)
*B60L 3/00* (2019.01)
(Continued)

(52) U.S. Cl.
CPC ............. *B60L 3/0069* (2013.01); *B60L 50/51* (2019.02); *G01R 27/025* (2013.01)

(58) Field of Classification Search
CPC ...... B60L 3/0069; B60L 50/51; G01R 27/025
(Continued)

(56) References Cited

U.S. PATENT DOCUMENTS 3,617,655 A * 11/1971 Fischer .................... H04B 3/44 379/345
6,489,782 B1 * 12/2002 Baier ................. G01R 31/1245 324/544
(Continued)

FOREIGN PATENT DOCUMENTS

CN 203519737 U 9/2013
DE 10141504 A1 3/2003
(Continued)

OTHER PUBLICATIONS

International Search Report and Written Opinion datedApr. 13, 2022 from corresponding International Patent Application No. PCT/EP2021/086812.
(Continued)

*Primary Examiner* — Crystal L Hammond
*Assistant Examiner* — Lucy M Thomas

(57) ABSTRACT

The disclosure provides a vehicle electrical system equipped with a high-voltage branch and a first low-voltage branch, which is galvanically isolated from the high-voltage branch by insulation. The low-voltage branch has at least one low-voltage line, which leads to the high-voltage branch. The low-voltage branch has a voltmeter. The voltmeter is connected in a signal-transmitting manner to the at least one low-voltage line. Furthermore, the voltmeter is set up to detect whether an absolute voltage value of the at least one low-voltage line with respect to a ground potential of the vehicle electrical system lies above a voltage limit. The voltage limit defines an absolute voltage value which is greater than the absolute value of a maximum signal voltage of the low-voltage line, which the low-voltage line has during fault-free operation.

11 Claims, 2 Drawing Sheets

(51) Int. Cl.
*B60L 50/51* (2019.01)
*G01R 27/02* (2006.01)
*H02H 9/08* (2006.01)

(58) Field of Classification Search
USPC .......................................................... 361/42
See application file for complete search history.

(56) References Cited

U.S. PATENT DOCUMENTS

| | | | |
|---|---|---|---|
| 2009/0015973 | A1 | 1/2009 | Trunk |
| 2013/0300430 | A1 | 11/2013 | Lindsay |
| 2017/0106754 | A1 | 4/2017 | Schmelzer |
| 2021/0129675 | A1 | 5/2021 | Isaksson |

FOREIGN PATENT DOCUMENTS

| | | | |
|---|---|---|---|
| DE | 102011105971 | A1 | 2/2012 |
| DE | 102014205877 | A1 | 10/2015 |
| DE | 102018214658 | A1 | 3/2019 |
| DE | 102018201546 | A1 | 8/2019 |
| DE | 102018217574 | A1 | 4/2020 |
| DE | 102019207920 | A1 | 12/2020 |
| EP | 1291998 | A2 | 3/2003 |
| EP | 3608152 | A1 | 2/2020 |
| JP | 2019050668 | A | 9/2017 |
| WO | 2019149416 | A1 | 8/2019 |

OTHER PUBLICATIONS

German Office Action dated Sep. 24, 2021 for corresponding German Patent Application No. 10 2021 200 414.8.

Chinese Office Action dated Aug. 8, 2025 for corresponding Patent Application No. 202180091143.6.

* cited by examiner

VEHICLE ELECTRICAL SYSTEM HAVING A HIGH-VOLTAGE BRANCH, A LOW-VOLTAGE BRANCH, AND LOW-VOLTAGE-SIDE INSULATION FAULT DETECTION

CROSS-REFERENCE TO RELATED APPLICATIONS

This application claims the benefit of PCT Application PCT/EP2021/086812, filed Dec. 20, 2021, which claims priority to German Application 10 2021 200 414.8, filed Jan. 18, 2021. The disclosures of the above applications are incorporated herein by reference.

TECHNICAL FIELD

The disclosure relates to a vehicle electrical system having a high-voltage branch, a low-voltage branch, and low-voltage-side insulation fault detection.

BACKGROUND

Vehicles having an electric drive have drive components which are operated to achieve high powers using a high voltage ("high-voltage components"), in order to achieve a high traction power in such a manner. Furthermore, vehicles have further electrically operated components, such as an on-board computer, safety devices, assistance systems, bodywork and other control devices, which have signal-processing and signal-emitting tasks, which can be operated with a lower voltage (low voltage), typically with voltages of 12 V-14 V or even 24 V.

High protection requirements exist for the high-voltage components to avoid a contact voltage which is dangerous to humans. These protection requirements relate, for example, to insulation measures of the high-voltage branch, in which the high-voltage components are provided. Therefore, it is desirable to indicate measures, using which vehicle users can be further protected from dangerous contact voltages.

SUMMARY

One aspect of the disclosure provides a method to detect insulation faults not only on a high-voltage side to take protective measures, but also on a low-voltage side, as it has been recognized that a danger can even originate from low-voltage lines, such as data, signal or other low-voltage-carrying lines (low-voltage lines), if these lines are led out from the high-voltage branch and take on a high-voltage potential due to faults in the high-voltage branch. The measures described here are used for reducing the danger of high contact voltages, which may exist due to these lines.

Implementations of the disclosure may include one or more of the following optional features. In some implementations, in a vehicle electrical system, which is equipped with a high-voltage branch and a (first) low-voltage branch which is isolated therefrom, the disclosure provides monitoring the voltage on a low-voltage line which is led out of the high-voltage branch on the side of the low-voltage branch using a voltmeter. A voltmeter detects if the voltage of the low-voltage line (or the absolute value thereof) lies above a predetermined voltage limit value. As a result, it is possible to determine, by way of the voltmeter, whether a dangerous high-voltage potential is carried out of the isolated high-voltage branch by the low-voltage line due to a fault, and therefore dangerous contact voltages possibly exist, for example on the low-voltage side.

A vehicle electrical has a high-voltage branch and a low-voltage branch, where the high-voltage branch is galvanically isolated with respect to the low-voltage branch by insulation. The insulation may, for example, have insulation-bridging components (optocouplers, transformers, instrument transformers, current transformers, insulating digital interfaces) and/or insulation material (insulation layers of line, printed circuit board, connector, etc.). An insulation fault exists, for example, in an undesired conductive bridge between low-voltage branch and high-voltage branch, for example a bridge which bridges the components mentioned or the insulation material, which provides the galvanic isolation between the branches, from one branch to the other.

The low-voltage branch has at least one low-voltage line leading to the high-voltage branch, for example to monitor operating parameters there, such as plugging state, voltage, power, temperature or current from the side of the low-voltage branch or to actuate components in the high-voltage branch. The low-voltage branch is guided via the insulation mentioned to the high-voltage branch and, in insulation-fault-free operation, has no galvanic connection to the same (due to the insulation). The low-voltage branch has a voltmeter, which is connected in a signal-transmitting manner to the at least one low-voltage line. "Connected in a signal-transmitting manner" here refers to a galvanically non-isolating connection between line and voltmeter, i.e., a direct connection, a connection via a series resistor or else a connection via a voltage divider.

The voltmeter is set up to detect whether an absolute voltage value between the at least one low-voltage line with respect to a ground potential of the vehicle electrical system lies above a voltage limit. This characterizes a voltage which usually does not occur in an operating state which is free from insulation faults and characterizes voltages which occur due to contact of the low-voltage line to a high-voltage potential at the low-voltage line. The voltage limit characterizes an absolute voltage value caused by faults and is greater than the absolute value of a maximum signal voltage of the low-voltage line, which the low-voltage line has during fault-free operation. The maximum signal voltage of the low-voltage line corresponds, for example, to the maximum signal level of the relevant low-voltage line. The voltage limit may also characterize an absolute value, from which it is possible to assume a danger to a human, such as 45 V, 50 V or 60 V. The voltmeter is used as a detection device for detecting voltages which, due to a fault in the high-voltage branch, lie above the voltages of the low-voltage branch and which are applied at the low-voltage line. The voltage detected by the voltmeter corresponds to the potential difference of the low-voltage line with respect to a reference potential such as ground (of the low-voltage branch) or a supply potential of the low-voltage branch, such as a +12 V potential.

The prefix "low-voltage" in particular characterizes voltages of no more than 60 V. The prefix "high-voltage" in particular characterizes voltages of more than 60 V, for example of at least 100 V, 200 V, 400 V or 800 V.

The low-voltage line may be a sensor line, which leads to a current sensor, a shunt, a temperature sensor, a voltage tap or a different component which is located inside the high-voltage electrical system. The at least one low-voltage line may therefore have (at least) one sensor line, which is connected in a signal-transmitting manner to a sensor or a voltage tap of the high-voltage branch or an interlock connection of the high-voltage branch. The sensor line may lead to an interlock circuit, which is arranged on a plug-in component of the high-voltage branch, in order to monitor same. If the relevant monitoring unit is located in the low-voltage branch, then a corresponding low-voltage line is led out from the high-voltage branch to the low-voltage branch, in order to connect the monitoring unit to the interlock circuit. The voltmeter enables monitoring of this low-voltage line also. For example, galvanically non-isolated connections which lead out of the high-voltage branch via a voltage divider or directly are termed "signal-transmitting". Even in the case of galvanically isolating actuation of an inverter or rectifier or DC-to-DC voltage converter of the high-voltage electrical system, starting from the low-voltage vehicle electrical system, there is a line section which leads to the galvanically isolating element, where this line section is monitored by the voltmeter and therefore constitutes a low-voltage line, as is described here.

The low-voltage line may further have an actuation or data line, which is connected in a signal-transmitting manner to a data source or sink of the high-voltage electrical system, for example a line of a CAN bus, a battery management device or an inverter, a voltage converter or an electric machine, which is led out from the high-voltage branch. For example, this may be an actuation line for an inverter, for a voltage converter, for an electric machine, high-voltage box or rechargeable battery, which are provided in the high-voltage electrical system or which carry a high voltage as operating voltage.

In combination or as an alternative, the at least one low-voltage line may be a low-voltage supply line, which is connected to a (sub)-component of the high-voltage electrical system, in order to supply the (sub)-component with low voltage.

The at least one low-voltage line may be connected via a series resistor to an input of the voltmeter. A varistor may additionally be connected to the at least one low-voltage line, for example, with a breakdown voltage which corresponds to the voltage limit. The varistor connects the low-voltage line to the reference potential, for example to the ground potential of the vehicle electrical system. The series resistor is connected in a switchable manner to the input of the voltmeter. Here, a switch, such as a transistor or an electromechanical switch, which leads to the input of the voltmeter, can be connected downstream of the series resistor. If there is a connection from the series resistor to a reference potential, such as ground, via a shunt resistor, then the switch can only be closed temporarily, such as repeatedly and for example periodically, to avoid a permanent discharge via the shunt resistor in rest phases of the vehicle electrical system.

The analysis of a plurality of low-voltage lines by the voltmeter can also be bundled. In this case, a plurality of low-voltage lines are respectively connected via a series resistor (to which a varistor can be connected, as described) to an input of the voltmeter, i.e., to the same input of the voltmeter. If only one of the low-voltage lines has an excessive voltage (with respect to ground or a different reference potential of the low-voltage branch), then the voltmeter can detect that at least one of the lines is carrying a critical potential. The varistor is furthermore used to discharge an energy storage device such as a Cy capacitor in the high-voltage branch; in a symmetrical configuration, the Cy capacitor connected to the high-voltage potential with defective insulation is discharged via the varistor, where the charge is supplied to the other Cy capacitor. Therefore, the varistor can also be used for charge reversal from one Cy capacitor to the other Cy capacitor (of the other high-voltage potential). This function of the varistor does not impair the detection of the insulation fault by the voltmeter, as the voltage applied at the varistor is sufficient for detecting the excessive absolute voltage value.

The vehicle electrical system and in particular the low-voltage branch may have a fast-turn-off signal switch. The voltmeter can be connected to the fast-turn-off signal switch in an actuating manner. For example, an input of the voltmeter can be connected in an actuating manner to the fast-turn-off signal switch. In other words, the low-voltage line is connected to this signal switch in an actuating manner, in order to control the signal switch (indirectly) depending on the voltage at the low-voltage line. If the voltage at the low-voltage line lies above the voltage limit, this signal switch is closed and a signal is generated as follows. In other words, the at least one low-voltage line can be connected to a control input of the fast-turn-off signal switch in a signal-transmitting manner, for example via a series resistor, in order therefore to switch (for example, to close) the fast-turn-off signal switch by way of the signal which is applied at the low-voltage line. Due to the switching, a fast-turn-off signal is generated, which is transmitted to the fast-turn-off unit.

The fast-turn-off signal switch may be connected between a ground potential or a different reference potential of the vehicle electrical system on one side and a signal connection, which leads to a fast-turn-off unit of the high-voltage electrical system. The fast-turn-off signal switch can therefore be connected between a reference potential, such as ground, and a fast-turn-off line. If there is a voltage on a low-voltage line, which lies above the limit mentioned, then the signal switch is closed by way of the voltage level at the input of the fast-turn-off signal switch (possibly corresponding to the voltage level at the input of the voltmeter). The signal switch then connects the fast-turn-off line to a reference potential, such as ground, and as a result generates a signal in the fast-turn-off line, which leads to a fast turn off.

The fast-turn-off unit is also termed an "FTO" (fast-turn-off) unit. The signal corresponds to an FTO signal, i.e., a signal for fast turn off. Closing the fast-turn-off signal switch leads to a signal on the fast-turn-off line or in the fast-turn-off unit of the high-voltage electrical system, which leads the fast-turn-off unit to directly turn off or deactivate the high-voltage electrical system, for example also to discharge the high-voltage electrical system. The fast-turn-off signal switch may be a transistor, the control input (base, gate) of which is connected to the output of the voltmeter. The fast-turn-off signal switch is set up and connected in such a manner that only in the event of a voltage on a low-voltage line, which lies above the voltage limit, does the signal switch close and otherwise the signal switch is open. The input of the voltmeter is connected to the fast-turn-off signal switch in an actuating manner. The voltage or the potential at the voltmeter therefore actuates the signal switch. In other words, the fast-turn-off signal switch is actuated by the voltage across the shunt resistor. The voltage applied at the voltmeter is therefore used on the one hand to be detected by the voltmeter for later analysis and on the other hand for actuating the aforementioned signal switch, which is closed in a manner dependent on the applied voltage. The fast-turn-off unit can be provided inside the high-voltage branch, but can also be provided generally in the vehicle electrical system, possibly even outside the electrical systems mentioned.

The vehicle electrical system may further have a signaling unit. This signaling unit is provided in the low-voltage branch. The signaling unit is set up to emit an insulation fault signal if the absolute voltage value is greater than the voltage limit. The insulation fault signal indicates that the absolute voltage value on a low-voltage line is greater than the given voltage limit and therefore an insulation fault (in the high-voltage branch) leads to a low-voltage line defectively carrying a voltage (with respect to a reference potential such as ground) above the voltage limit. The insulation fault signal may be an electric signal, which is transmitted to a superordinate control or display or else to a charging control of the high-voltage branch. Alternatively to or in combination with this, the insulation fault signal may be an optical and/or acoustic signal.

In some implementations, the vehicle electrical system has a debouncing device, which is set up to suppress an absolute voltage value, which lies above the voltage limit, during a debouncing time period, either by temporary suppression of the corresponding voltage signal which is output by the voltmeter or by suppression of an insulation fault signal during the debouncing time period. If, following the debouncing time period, the excessive voltage or the insulation fault signal continues, the voltage signal output by the voltmeter or the insulation fault signal is output as described, in order to detect an insulation fault.

The voltmeter can be an analog-to-digital converter. The analog-to-digital converter can have a measurement input (abbr.: input), which is connected in a signal-transmitting manner (such as galvanically or via the series resistor) to the at least one low-voltage line. The input may be connected via a shunt resistor to ground or a different reference potential of the low-voltage branch. A voltage divider is created, where connection takes place between ground or a different reference potential and the low-voltage line, which voltage divider has the series resistor and the shunt resistor as voltage-dividing resistors, which are connected in series, and which voltage divider has, with the connecting points between series resistor and shunt resistor, a tap, which is connected to the input.

The shunt resistor is usually equipped with a considerably larger resistance value than shunt resistors for current detection and may for example be more than 1 kohm, 10 kohms or 100 kohms. The series resistance or the series resistances may be more than 100 kohms, more than 1 Mohm or more than 10 Mohms. The shunt resistance and the series resistance reduce the voltage, which is applied across the shunt resistor and the series resistor, by a factor of not more than 10%, 5% or 1%, where the thus-reduced voltage is applied across the shunt resistor.

Furthermore, it may be provided that the sum of the resistance values of shunt resistor and one of the series resistors is smaller than a resistance value which, if the nominal voltage of the high-voltage branch is applied at the relevant low-voltage line, leads to a current, the value of which is greater than a trip current of an insulation monitor on the high-voltage branch side. As a result, an excessive potential on the low-voltage line can be detected both by the voltmeter described here and by the insulation monitor.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
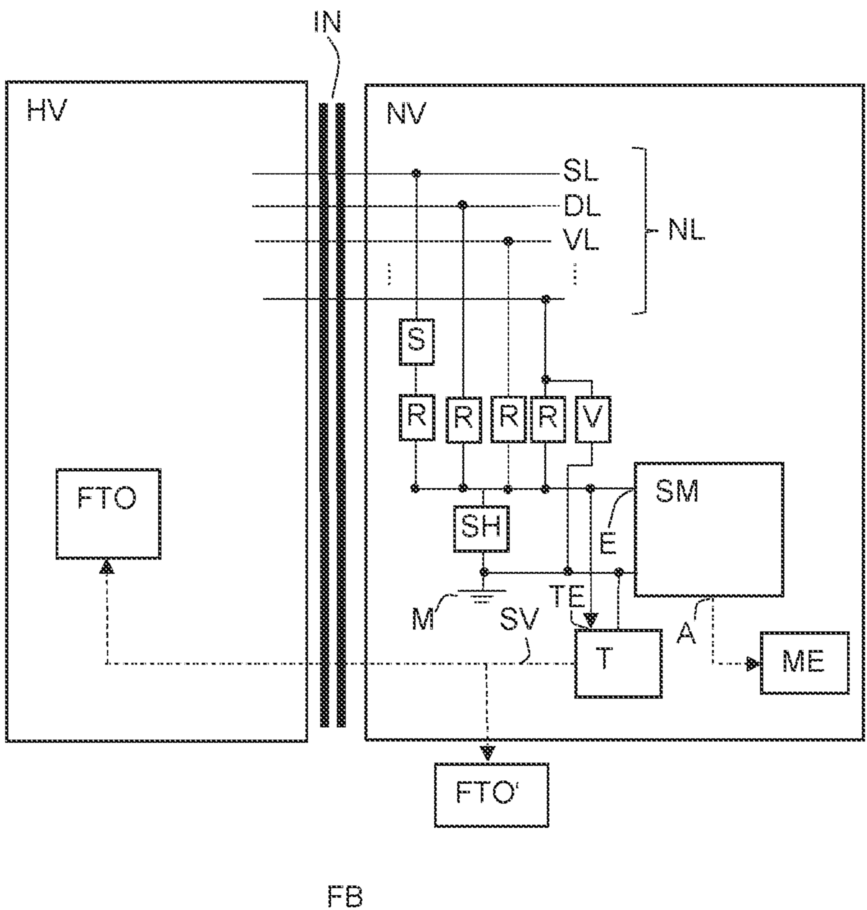
FIGS. 1-3 are schematic views of an exemplary vehicle electrical system.

A vehicle electrical system FB illustrated in FIG. 1 has a high-voltage branch HV and a low-voltage branch NV. The branches NV and HV are isolated from one another by way of insulation IN. The electrical insulation IN is illustrated symbolically and may correspond to a transformer and/or electrical insulation layers.

A plurality of low-voltage lines NL extend from the high-voltage branch into the low-voltage branch. A signal line (for example for transmitting signals of a sensor, which is located inside the high-voltage branch), a data line (for transmitting actuation signals and/or communication or bus signals) leading out of the high-voltage branch HV or into the same, and a supply line for transmitting low-voltage supply voltage between the branches NV and HV are illustrated by way of example. For example, these low-voltage lines may be a 12 V+ supply line, a communication line (such as a CAN bus line), an HV interlock loop line or a signal line for terminal 15 of the vehicle electrical system (i.e., connected 12 V+ potential).

The low-voltage line NL can, as illustrated by way of example using line SL, be connected, switched via a switch S, and via a series resistor R to an input E of the voltmeter SM. The low-voltage line NL can, as illustrated by way of example using the lines DL and VL, be connected unswitched, via a series resistor R to the input E of the voltmeter SM. Furthermore, the low-voltage line NL can, as illustrated by way of example using the line XL, which leads to a low-voltage section of a component of the vehicle electrical system branch HV, be connected to the input E of the voltmeter SM via the parallel connection of a series resistor R and a varistor V. The varistor has a breakdown voltage which is smaller than a contact voltage which is dangerous for humans and therefore generates a current flow when this voltage is reached, where this is detected by a high-voltage-side insulation monitor. Therefore, the current flow through the varistor already triggers fault detection (on the part of a high-voltage-side insulation monitor).

The voltmeter SM outputs a signal at the output A, which reproduces the voltage at the input E of the voltmeter. As shown, this voltage is forwarded to a signaling unit ME of the vehicle electrical system FB. The signaling unit ME is capable of analyzing the signal of the output A and detecting whether the voltage value which is reproduced by the signal allows a conclusion to be drawn about an absolute voltage value with respect to ground M on one of the low-voltage lines, which lies above the voltage limit (for example 30 V, 50 V or 60 V) or not. The signaling unit M is furthermore capable of taking account of the resistance values of R and SH and the wiring thereof as a voltage divider (i.e., the voltage division by R and SH) in the assessment of the voltage value which is output by the signal at the output A of the voltmeter SM. The signaling unit therefore compares the absolute value of the voltage which is applied at the lines NL with respect to ground M (or a different reference potential) with the voltage limit and outputs an insulation fault signal if the voltage limit (for example 60 V) is being exceeded or is exceeded. If the low-voltage lines are operating with signal levels of 0 volt-x volt(s), then the voltage limit lies above the maximum level of x volt(s). For a communication line as line NL, x may be 5 volts, 10 volts, 12 volts or 15 volts. For an actuation line as line NL, for example for high-voltage transistors in the high-voltage branch, x may be in the region of 10 volts, 12 volts, 15 volts or 18 volts, depending on the required gate or base voltage for actuating the transistor.

Furthermore, a fast-turn-off unit FTO (FTO=fast turn off) may be provided, for example as illustrated in the high-voltage branch HV. This fast-turn-off unit is capable of disconnecting the high-voltage branch HV or a high-voltage energy source in the event of an insulation fault (for example output by a high-voltage insulation monitor). The fast-turn-off unit FTO can be provided within the high-voltage branch, as illustrated with the reference sign FTO, but can also be provided generally in the vehicle electrical system, possibly even outside the electrical systems mentioned, as is illustrated with the reference sign FTO'.

The illustrated circuit allows a direct intervention into this fast-turn-off unit FTO, in that a fast-turn-off signal switch T is actuated by the potential which is applied at the lines NV. The illustrated example provides that the fast-turn-off signal switch T connects a reference potential such as ground M in a switchable manner to a signal input or a signal-carrying line of the fast-turn-off unit FTO (i.e., a line of the vehicle electrical system, which carries the fast-turn-off signal). In addition, there is a signal connection SV between the switch T and the fast-turn-off unit FTO. The connection can generally be between the switch T and a line which carries the fast-turn-off signal (FTO signal).

In the example illustrated, as illustrated by the arrow leading to T, the fast-turn-off signal switch T is switched by the (common) potential of the resistors R or by means of the voltage applied across SH (in general terms: using the voltage applied at the lines NL). The fast-turn-off signal switch T is a normally open contact or a transistor which is normally off. The signal of at least one of the lines NL is therefore supplied directly or indirectly to the control input TE of the fast-turn-off signal switch T, in order to close according to this signal, if the signal corresponds to a voltage sufficient for switching. The switching point of the fast-turn-off signal switch T is provided in such a manner that when the voltage limit is reached at one of the lines NL, the fast-turn-off signal switch T closes.

Due to the closing of the fast-turn-off signal switch T, the potential of the line which is carrying the FTO signal is set to the reference potential (here: ground M). This potential or this level corresponds to a fault signal, which trips the fast-turn-off unit FTO.

The fast-turn-off signal switch T can have a transistor (a signal transistor) as switch. For example, the fast-turn-off signal switch T can have a series resistor, which leads to the control input (base) of the transistor. The end of the series resistor opposite the base can be connected to the shunt resistor, for example to the end of the shunt resistor, which is opposite the reference potential (ground M). The transistor can be connected to the reference potential (ground M) via a resistor (emitter resistor). In addition, a resistor can be provided for adjusting the operating point of the transistor, which connects the base to the emitter. The result for the fast-turn-off signal switch T is a common collector circuit with operating point adjustment. Corresponding wiring of a MOSFET can be provided, if the fast-turn-off signal switch T has a MOSFET. Furthermore, a further transistor (possibly with further wiring) can be provided, which is at a negative potential of one of the lines NL, which corresponds to an absolute value of a negative voltage, which lies above the voltage limit. Therefore, a further transistor can be provided, which is provided in a complementary manner to the previously described transistor.

Figure 2:
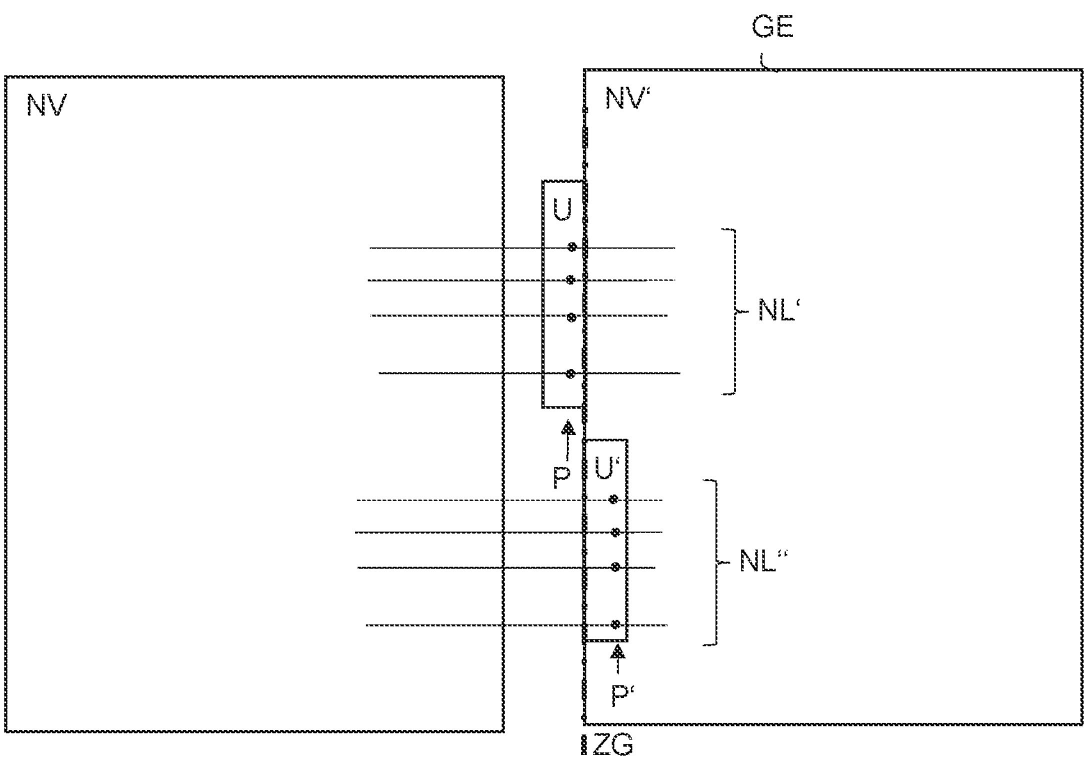
Figure 3:
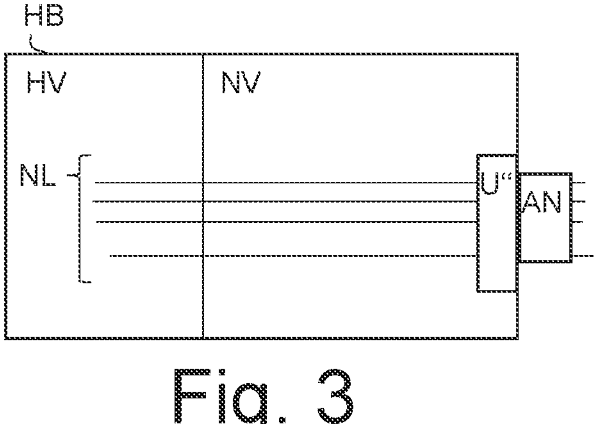

FIGS. 2 and 3 are used for explaining possible physical aspects of the vehicle electrical system FB. In addition to the first low-voltage branch NV, there may be a second low-voltage branch NV', where the at least one low-voltage line extends from the first low-voltage branch NV also into the second low-voltage branch NV'. If the low-voltage line has a dangerous potential, then this danger is also transmitted via this line to the second low-voltage branch, even if a housing GE is provided, in which the second low-voltage branch is accommodated, while the first low-voltage branch NV is arranged outside the housing GE, and the at least one low-voltage line NL', NL" extends via a housing inlet ZG of the housing GE into the housing and therefore into the second low-voltage branch.

The at least one low-voltage line has a tap P, P', via which the voltmeter SM is connected to the at least one low-voltage line. The tap is at the point of the line at which the line begins to extend further in a plurality of directions, i.e., at the point of the splitting. The tap P, P' may be located directly on the housing case of the housing GE or at the housing inlet ZG of the housing, be it inside (as illustrated with P) or outside the housing P'. The tap P can be arranged in an interface device, which is located outside the housing GE, see interface device U, or can be arranged in an interface device, which is located inside the housing GE, where the interface device, for example a cable passthrough or a plug-in connection element, directly adjoins the housing inlet or also realizes the same. The tap P, P' is therefore located directly where the second low-voltage branch NV' begins or where the housing chamber begins, in which chamber the tap P, P' is located. As a result, it is ensured that the line can already be monitored, upon entry into the second low-voltage branch NV', with regards to overvoltages, by the voltmeter. For example, the voltmeter, the at least one series resistor and/or the shunt resistor can also be arranged directly where the tap is located. An interface device can be provided, in which the tap P, P' is provided. The interface device can be provided outside, see reference sign U. Alternatively or in combination therewith, the interface device can be provided inside, see reference sign U'.

Furthermore, the first low-voltage branch NV and the high-voltage branch HV may be located in a high-voltage housing HB, for example, inside the housing of a high-voltage arrangement, which can be termed a high-voltage box. The high-voltage housing HB or the high-voltage box has a low-voltage line connection AN. This may be a plug-in connection for low-voltage signals and/or low-voltage supply voltages. The at least one low-voltage line NL has a tap, via which the voltmeter SM is connected to the at least one low-voltage line NL. This tap may be designed like the above-mentioned voltage tap. The tap P is located directly in or on the low-voltage line connection AN (for example a plug-in connection element), but may also be located in the interface device U", which is forward of the low-voltage line connection AN. For example, the housing HB is conductive and connected to ground. This ensures a high protection from high contact voltages, which result due to faults in the high-voltage box, as the tap is provided directly at the exit of the low-voltage line NL from the high-voltage box and therefore this line is already monitored with regards to excessive contact voltages directly after the exit. The voltmeter SM, the at least one series resistor R and the shunt resistor SR (possibly also the varistor V) are also, in some examples, arranged there.

In some implementations, the voltmeter SM, the at least one series resistor R and the shunt resistor SR (possibly also the varistor V) are provided in a housing and thus form a high-voltage safety device. For example, the tap is also provided inside the high-voltage safety device, where alternatively, the high-voltage safety device has a connection for connecting to the at least one tap or for connecting to the at least one low-voltage line. Furthermore, the signaling unit ME can also be provided inside the high-voltage safety device. A communication device can also be provided in the high-voltage safety device. The at least one low-voltage line can lead through the high-voltage safety device or can be provided outside. The high-voltage safety device can be provided where the components labeled with U, U', U" or AN are provided in FIGS. 2 and 3, for example instead of these components or combined with these components. Such a high-voltage safety device, which monitors the low-voltage lines, may be a physically separate device, which can also be connected to the ends of the low-voltage lines which are opposite the sections or ends of the low-voltage lines, which are located in the high-voltage branch HV.

A number of implementations have been described. Nevertheless, it will be understood that various modifications may be made without departing from the spirit and scope of the disclosure. Accordingly, other implementations are within the scope of the following claims.

What is claimed is:

1. A vehicle electrical system for detecting insulation faults, the vehicle electrical system comprises:

a high-voltage branch comprising a sensor;

insulation comprising insulation-bridging components and/or insulation material;

a first low-voltage branch galvanically isolated from the high-voltage branch by the insulation, the first low-voltage branch includes:

a plurality of low-voltage lines extending from the high-voltage branch into the low-voltage branch, the plurality of low-voltage lines functionally distinct and includes:

a signal line for transmitting signals from the sensor, an actuation or data line for interfacing with a data source or sink of the high-voltage branch, and a low-voltage supply line, the plurality of low voltage lines operate with signal levels between 0 volt to 18 volts; and a voltmeter having an input for receiving the plurality of low-voltage lines, the voltmeter detects when an absolute voltage value of the at least one of the plurality of low-voltage lines, with respect to a ground potential of the vehicle electrical system, lies above a voltage limit, the voltage limit defines an absolute voltage value greater than an absolute value of a maximum signal voltage of the low-voltage line, which the low-voltage line has during fault-free operation, wherein the plurality of low-voltage lines are led out from the high-voltage branch and are monitored by the voltmeter on the first low-voltage branch; and wherein the plurality of low-voltage lines are respectively connected via a series resistor to the input of the voltmeter and the input is connected via a shunt resistor to the ground potential of the vehicle electrical system.

2. The vehicle electrical system of claim 1, wherein a sensor line is connected in a signal-transmitting manner to a sensor or a voltage tap of the high-voltage branch or an interlock connection of the high-voltage branch.

3. The vehicle electrical system of claim 1, wherein the actuation or data line is connected in a signal-transmitting manner to a data source or sink of the high-voltage electrical system.

4. The vehicle electrical system of claim 1, wherein the low-voltage supply line is connected to a component of the high-voltage electrical system.

5. The vehicle electrical system of claim 1, wherein the at least one low-voltage line is connected, in a switchable manner, via a series resistor to which a varistor is connected, to an input of the voltmeter.

6. The vehicle electrical system of claim 1, further comprising:

a fast-turn-off signal switch, wherein an input of the voltmeter is connected in an actuating manner to the fast-turn-off signal switch, or the at least one low-voltage line is connected in a signal-transmitting manner to a control input of the fast-turn-off signal switch, to actuate the fast-turn-off signal switch by the signal which is applied at the input of the voltmeter or at the low-voltage line, wherein the fast-turn-off signal switch is connected between a ground potential or a different reference potential of the vehicle electrical system on one side and a signal connection, which leads to a fast-turn-off unit of the high-voltage electrical system.

7. The vehicle electrical system of claim 1, wherein the low-voltage branch includes a signaling unit emitting an insulation fault signal when the absolute voltage value is greater than the voltage limit.

8. The vehicle electrical system of claim 7, wherein the signaling unit is set up to emit an insulation fault signal when the absolute voltage value is greater than the voltage limit at least over a predetermined debouncing time period.

9. The vehicle electrical system of claim 1, wherein the voltmeter is an analog-to-digital converter having a measurement input and connected in a signal-transmitting manner to the at least one low-voltage line.

10. The vehicle electrical system of claim 1, further comprising:

a second low-voltage branch, the at least one low-voltage line extends from the first low-voltage branch into a housing of the second low-voltage branch and the at least one low-voltage line has a tap, via which the voltmeter is connected to the at least one low-voltage line, the tap is located directly on a housing case or a housing inlet of the housing and inside or outside the housing.

11. The vehicle electrical system of claim 1, wherein the first low-voltage branch and the high-voltage branch are located in a high-voltage housing, which has a low-voltage line connection, wherein the at least one low-voltage line has a tap, via which the voltmeter is connected to the at least one low-voltage line, wherein the tap is located in or directly on the low-voltage line connection.

* * * * *